(12) United States Patent
Zhang et al.

(10) Patent No.: US 10,204,818 B2
(45) Date of Patent: Feb. 12, 2019

(54) DEVICE FOR HOLDING AND ROTATING PLATE SHAPED ARTICLE

(71) Applicant: NAURA TECHNOLOGY GROUP CO., LTD., Beijing (CN)

(72) Inventors: Bao Zhang, Beijing (CN); Dandan Ji, Beijing (CN); Ruiting Wang, Beijing (CN); Yi Wu, Beijing (CN)

(73) Assignee: NAURA TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/541,015

(22) PCT Filed: Jul. 10, 2015

(86) PCT No.: PCT/CN2015/083727
§ 371 (c)(1),
(2) Date: Jun. 29, 2017

(87) PCT Pub. No.: WO2016/107131
PCT Pub. Date: Jul. 7, 2016

(65) Prior Publication Data
US 2017/0358480 A1    Dec. 14, 2017

(30) Foreign Application Priority Data

Dec. 31, 2014 (CN) .......................... 2014 1 0851693

(51) Int. Cl.
*H01L 21/687* (2006.01)
*H01L 21/67* (2006.01)

(52) U.S. Cl.
CPC .... *H01L 21/68721* (2013.01); *H01L 21/6875* (2013.01); *H01L 21/68728* (2013.01); *H01L 21/68764* (2013.01); *H01L 21/67051* (2013.01)

(58) Field of Classification Search
None
See application file for complete search history.

(56) References Cited

U.S. PATENT DOCUMENTS

| | | | |
|---|---|---|---|
| 5,989,342 A | 11/1999 | Ikeda et al. | |
| 6,678,581 B2 | 1/2004 | Hung et al. | |
| 7,284,760 B2 | 10/2007 | Siebert et al. | |
| 2013/0219693 A1* | 8/2013 | Wu | H01L 21/68728 29/559 |
| 2015/0279708 A1* | 10/2015 | Kobayashi | C23C 16/458 438/747 |

* cited by examiner

Primary Examiner — Jethro M. Pence
(74) Attorney, Agent, or Firm — Tianchen LLC.

(57) ABSTRACT

A device for holding and rotating a plate shaped article comprises a group of fixed pins and a group of pivot pins arranged along the circumference of the movable base in a manner that each pivot pin opposites a fixed pin, and also comprises magnetic bodies positioned within and outside two opposing sides of the pivot pins. Each of the pivot pins can be driven to rotate around its pivot back and forth under the magnetic repulsive force between two adjacent magnetic bodies, so as to release or clamp the plate shaped article. The present invention has advantages of simple structure, convenient and reliable action control, controllable clamping force and good compatibility with various processing chambers.

16 Claims, 3 Drawing Sheets

DEVICE FOR HOLDING AND ROTATING PLATE SHAPED ARTICLE

CROSS-REFERENCE TO RELATED APPLICATION

This application claims the priority benefit of International Patent Application Serial No. PCT/CN2015/083727, filed Jul. 10, 2015, which is related to and claims the priority benefit of China patent application serial No. 201410851693.5, filed Dec. 31, 2014. The entirety of each of the above-mentioned patent applications is hereby incorporated by reference herein and made a part of this specification.

FIELD OF THE INVENTION

The present invention generally relates to the field of semiconductor manufacturing equipment, and more particularly, to a device for holding and rotating a plate shaped article.

BACKGROUND OF THE INVENTION

During the manufacturing process for integrated circuits, circular plate shaped articles like semiconductor chips of silicon or wafers are subjected to various processes such as film deposition, etching, cleaning, polishing, etc. During such processes, the plate shaped article is supported, clamped and rotated by a rotatable holding device. Particularly, between different processes for the integrated circuits, cleaning is performed to the wafer after each process to remove the contaminants deposited thereon.

During the cleaning process to the chip of silicon or wafer by using the rotatable holding device, the chip of silicon or wafer is clamped and fixed by chuck pins which are circumferentially arranged on a base (chuck), and driven to rotate synchronously with the rotatable holding device by a rotary actuator connected below the base, such that the chemical liquid or gas can uniformly cover the whole surface of the product to achieve the cleaning process for the product. Herein, the structure, clamping manner, position, clamping force of the chuck pins, and the response capability of the rotary actuator are critical to the safety and cleaning effect of the cleaning process.

Generally, the chuck pins present three status corresponding to three stages of the cleaning process: firstly, in a loading stage, the chuck pins are released such that the plate shaped article can be loaded by a mechanical hand; then, in a processing stage, the chuck pins clamp the plate shaped article such that the plated shape article can be rotated along with the rotatable chuck; finally, in an unloading stage, the chuck pins are released again such that the plate shaped article can be unloaded by the mechanical hand.

The conventional rotatable holding device can be divided into three types based on different structures and principles: the first type is clamping the plate shaped article by chuck pins through gear engagement; the second type is clamping the plate shaped article by chuck pins through magnetic force; the third type is clamping the plate shaped article through other means like electrostatic chuck or gas cushion.

However, the above conventional devices for holding and rotating a plate shaped article all exist many problems like complexity in structure and control, and process difficulties. Particularly, the conventional chuck pins are prone to be affected by the centrifugal force and the gravity during the high speed rotation of the rotatable chuck, which requires extra design considerations in addition to the safety standard design or a relative short return stroke; on the other hand, mutual actions among more chuck pins may easily cause pollution due to the particles generated by friction. For the device applying electrostatic adhesion or gas cushion to hold the plate shaped article, it requires complicated design of control system and appropriate timing to control and move the chuck pins, or even specialized and expensive axis linkage rotary mechanisms. Furthermore, the conventional rotatable holding devices for plate like articles do not provide advantageous design in terms of control of the clamping force of the chuck pins, always resulting in product damages and particle generation during clamping the plate shaped article.

Accordingly, there exists a need to design a novel rotatory holding device for plate shaped articles with simple structure, easy and reliable motion control, and controllable clamping force.

BRIEF SUMMARY OF THE DISCLOSURE

Accordingly, an objective of the present invention is to provide a novel rotatory holding device for a plate shaped article with simple structure, easy and reliable motion control, and controllable clamping force, to overcome the above defects of the existing technology including structural complexity, processing difficulties, susception to the centrifugal force and the gravity, and particle generation.

To achieve the above objective, the present invention provides a device for holding and rotating a plate shaped article, comprising:

an annular rotatable chuck which is horizontally rotated when driven by a force;

an annular movable base and an annular fixed base which are positioned on the rotatable chuck from top to bottom and rotated synchronously with the rotatable chuck, wherein the movable base is drivable to move up or down;

a group of fixed pins and a group of pivot pins protruding from an upper surface of the movable base and arranged circumferentially along the movable base; wherein the fixed pins are fixedly connected to the movable base, the pivot pins are rotatably connected to the movable base, each pivot pin is positioned opposite to a fixed pin; a lower portion of each pivot pin below its pivot is provided with a first magnetic body; a second magnetic body connected to the movable base and a third magnetic body connected to the fixed base are provided outside each pivot pin opposing two sides of the first magnet; each two adjacent magnetic bodies have the same pole on their opposing surfaces, a repulsive force between the first magnetic body and the third magnetic body is greater than that between the first magnetic body and the second magnetic body; wherein, when the movable base moves down, each pivot pin rotates towards the inner of the movable base by the repulsive force between the first magnetic body and the third magnetic body and clamps the plate shaped article placed on the fixed pins in a direction towards the opposing fixed pin; when the movable base moves up, each pivot pin rotates towards the outside of the movable base by the repulsive force between the first magnetic body and the second magnetic body and releases the plate shaped article in a reverse direction.

Preferably, each pivot pin is L-shaped and fitted in a chamber having a corresponding shape with a spacing therebetween, the chamber is formed in the movable base and penetrates the movable base from up to down; the pivot pin has a vertical portion and a horizontal portion; the vertical portion is rotatable around a horizontal pivot shaft which is connected to an inner wall of the chamber, and has an upper end which extends from the chamber and protrudes an upper surface of the movable base; the horizontal portion extends outwardly; the center of gravity of the pivot pin is positioned outside and below the pivot shaft; the first magnetic body is positioned in the horizontal portion outside and below the center of gravity of the pivot pin; the second magnetic body is positioned above the first magnetic body and connected to the inner wall of the chamber, the third magnetic body is positioned below the first magnetic body and connected to the fixed base; the chamber has an opening formed below the horizontal portion; a bottom surface of the movable base is fixedly connected with a plurality of supporting rods which are arranged circumferentially along the movable base, the supporting rods penetrate the fixed base and the rotatable chuck sequentially; a lifting mechanism is provided below the rotatable chuck to drive the supporting rods up or down, so as to enable the movable base to go up from or fall down to the fixed base to allow the pivot pins to rotate towards the outer of the movable base around the pivot shaft under a resultant force of the repulsive force between the first magnetic body and the second magnetic body and the gravity torque to release the plate shaped article placed on the fixed pins, or rotate towards the inner of the movable base around the pivot shaft under the repulsive force between the first magnetic body and the third magnetic body against the gravity torque to clamp the plate shaped article.

Preferably, at an inner side, the fixed pin has a supporting surface for placing the plate shaped article, and also has a limiting surface together with the pivot pins for holding the plate shaped article and limiting a lateral movement of the plate shaped article; the pivot pin has a groove for clamping the plate shaped article at its inner side; active holding surfaces provided by the pivot pins and the fixed pins have the same height and match with a shape of the plate shaped article.

Preferably, the lifting mechanism comprises a lifting driving unit, connecting rods and a top plate which are sequentially connected; the lifting driving unit ascends or descends the connecting rods, and accordingly drives the top plate to ascend or descend the supporting rods, so as to enable the movable base to go up from or fall down to the fixed base.

Preferably, the first magnetic body, the second magnetic body and the third magnetic body are permanent magnets.

Preferably, a rotation angle of the pivot pin is limited by a spacing between the vertical portion of the pivot pin and a vertical portion of the inner wall of the chamber.

Preferably, a clamping force of the pivot pin is determined by the repulsive force between the first magnetic body and the third magnetic body.

Preferably, the amount of the pivot pins is at least two, the amount of the fixed pins is at least three.

Preferably, the movable base, the fixed base and the rotatable chuck are concentrically arranged in an annular form; a plurality of attractive permanent magnets are respectively positioned on opposing surfaces of the movable base and the fixed base; the fixed base is fixedly connected to the rotatable chuck.

Preferably, a processing chamber having an opening at an upper end is arranged enclosing the rotatable chuck with a spacing formed therebetween, a ring stator is arranged enclosing the processing chamber; the ring stator is provided with multiple coil windings; the rotatable chuck is provided with a corresponding magnetism mechanism; the ring stator generates an alternating magnetic field when the coil windings are fed with an alternating current, such that the magnetism mechanism in the rotatable chuck produces a magnetic field having an opposite orientation to drive the rotatable chuck to suspend and rotate in the processing chamber; nozzles are provided above and below the fixed pins and the pivot pins for spraying processing medium to an upper surface and a lower surface of the plate shaped article; an umbrella-shaped guide sleeve is provided within the processing chamber below the rotatable chuck for guiding the processing medium; a liquid outlet and an exhaust outlet are formed in the processing chamber; a movable multi-channel collecting vessel is provided above the opening of the processing chamber for collecting different processing medium splashed from the surface of the plate shaped article by the centrifugal force.

As is disclosed above, according to the present invention, by providing a group of fixed pins and a group of pivot pins arranged circumferentially along the movable base in a manner that each pivot pin opposites a fixed pin, and by positioning magnetic bodies within the pivot pins and outside two opposing sides of the pivot pins and driving each pivot pin to rotate around its pivot back and forth under the magnetic repulsive force between two adjacent magnetic bodies to release or clamp the plate shaped article, the adverse impact of the centrifugal force and the gravity on the clamping actions of the pivot pins can be avoided, reliable clamping to the plate shaped article can be achieved. Furthermore, with the ascending and descending of the lifting mechanism and the spacing of the chamber accommodating the pivot pin, the rotation of the pivot pin can be achieved and the rotation angle of the pivot pin can be controlled conveniently; with the appropriate selection of the magnetic bodies, a proper clamping force acting on the edge of the plate shaped article by the pivot pin can be realized. In addition, it also achieves convenience for maintenance and small space occupation for the processing chamber. Accordingly, the present invention has advantages of simple structure, convenient and reliable action control, controllable clamping force and good compatibility with various processing chambers.

DETAILED DESCRIPTION OF THE EMBODIMENTS

The invention will be described in further details hereinafter with reference to specific embodiments and accompanying drawings.

Note that in the following embodiment, all the accompanying drawings referred to are not necessarily drawn to scale, should be understood to be enlarged or distorted or simplified relative to others to facilitate convenience and clearness in explanation and understanding of the present invention, and not limit the scope of the invention.

Figure 1:
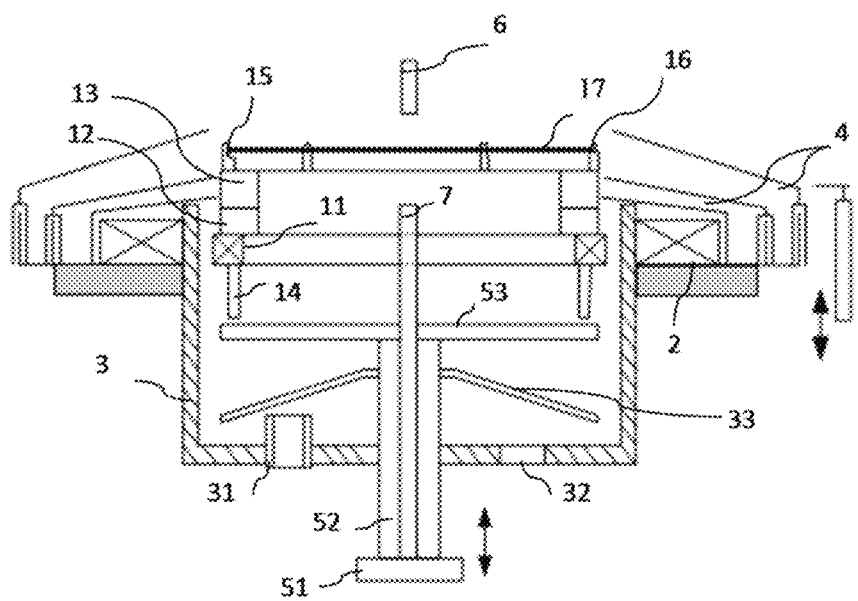
FIG. 1 is a structure diagram showing a device for holding and rotating a plate shaped article according to an embodiment of the present invention.

Please refer to FIG. 1, FIG. 1 is a structure diagram showing a device for holding and rotating a plate shaped article according to an embodiment of the present invention. As shown in FIG. 1, the device for holding and rotating a plate shaped article comprises an annular movable base 13, an annular fixed base 12 and a rotatable chuck 11 which are arranged concentrically from up to down. The movable base 13 is provided with a group of fixed pins 16 and a group of pivot pins 15 which are arranged circumferentially along the movable base 13 and protrude from an upper surface of the movable base 13. The fixed pins 16 are adapted to place the plate shaped article (e.g. semiconductor chip of silicon, wafer, etc.), the pivot pins 15 are adapted to clamp the plate shaped article 17 together with the fixed pins 16 or release the plate shaped article 17. The rotatable chuck 11 is horizontally rotated when driven by a force. The fixed base 12 is fixedly mounted on the rotatable chuck 11, while the movable base 13 is detachably provided on the fixed base 12. The movable base 13 and the fixed base 12 can be synchronously rotated along with the rotatable chuck 11.

Please refer to FIG. 1. The device for holding and rotating a plate shaped article can be compatible with various conventional processing chambers. The rotatable chuck 11 can be suspended and rotated in the processing chamber 3 by means of electromagnetic actuation to facilitate various processes to the plate shaped article which is hold and clamped by the chuck pins on the movable base 13. In an embodiment of the present invention, as shown in FIG. 1, a processing chamber 3 having an opening at an upper end is arranged enclosing the periphery of the rotatable chuck 11 with a spacing formed therebetween, a ring stator 2 is arranged enclosing the processing chamber 3. The ring stator 2 is provided with multiple coil windings, and the rotatable chuck 11 is provided with a corresponding magnetism mechanism. The ring stator 12 generates an alternating magnetic field when the coil windings are fed with an alternating current, such that the magnetism mechanism in the rotatable chuck 11 produces a magnetic field having an opposite orientation to drive the rotatable chuck 11 to suspend and rotate in the processing chamber 3.

Please refer to FIG. 1. Nozzles 6, 7 are provided above and below the chuck pins 15, 16 for spraying liquid/gaseous processing medium to an upper surface and a lower surface of the plate shaped article 17. Below the rotatable chuck 11, an umbrella-shaped guide sleeve 33 is provided within the processing chamber 3 for guiding the processing medium. A liquid outlet 32 and an exhaust outlet 31 are formed at the bottom of the processing chamber 3. The liquid outlet 32 discharges the processing medium flowing down along the guide sleeve 33, the exhaust outlet 31 exhausts the processed gas during the process. Furthermore, a collecting vessel 4 is provided above the opening of the processing chamber 3. The collecting vessel 4 is movable (in a direction indicated by the right arrow in the figure) and has multiple channels formed by multiple annular open sleeves. Different channels of the collecting vessel 4 are configured to collect different processing medium splashed from the surface of the plate shaped article 17 by the centrifugal force.

Figure 2:
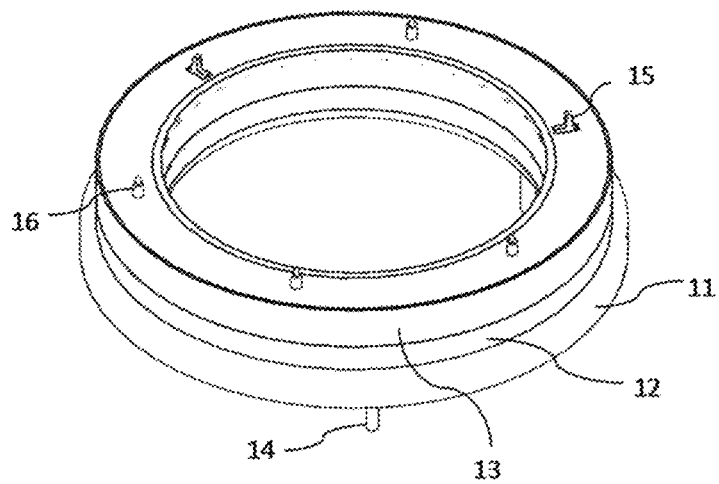
FIG. 2 is a stereogram showing a partial structure of the device for holding and rotating a plate shaped article according to an embodiment of the present invention.

Please refer to FIG. 2, which is a stereogram showing a partial structure of the device for holding and rotating a plate shaped article according to a preferred embodiment of the present invention. As shown in FIG. 2, a group of fixed pins 16 and a group of pivot pins 15 protrude from the upper surface of the movable base 13, and are arranged circumferentially along the movable base 13. At least two pivot pins 15 and at least three fixed pins 16 are provided. In the embodiment, four fixed pins 16 and two pivot pins 15 are mounted. The fixed pins 16 are fixedly and vertically mounted on the movable base 13, the pivot pins 15 are rotatably connected with the movable base 13. Each pivot pin 15 is positioned opposite to a fixed pin 16, that is, each pivot pin 15 and its opposing fixed pin 16 are positioned on a straight line passing through the center of the movable base 13 (the rest fixed pins 16 can be mounted at other positions on the periphery of the movable base 13). The design principle is that, since the clamping force of the pivot pin 15 is acting on the edge of the plate shaped article, it pushes the plate shaped article to an opposing side and results in a reacting force in a reverse direction produced by the fixed pin 16 positioned opposite to the pivot pin 15, such that both of the two forces aid to clamp the plate shaped article.

The movable base 13 is drivable to ascend from and descend to the fixed base 12. Please refer to FIG. 1 and FIG. 2. The movable base 13 is fixedly mounted with a plurality of supporting rods 14 at its bottom surface. The supporting rods 14 are arranged circumferentially along the movable base 13, and vertically penetrate the fixed base 12 and the rotatable chuck 11 sequentially. In the embodiment, as shown in FIG. 2, three supporting rods 14 are evenly mounted on the bottom surface of the movable base 13 at positions not mounted with the chuck pins (another rod 14 at the left side is obscured and not shown). Below the rotatable chuck 11, a lifting mechanism is provided. The lifting mechanism comprises a lifting driving unit 51, connecting rods 52 and a top plate 53 which are sequentially connected. The lifting driving unit 51 ascends or descends the connecting rods 52 (as indicated by the lower arrow), and accordingly drives the top plate 53 on the top of the connecting rods 52 to move up or down.

Figure 3:
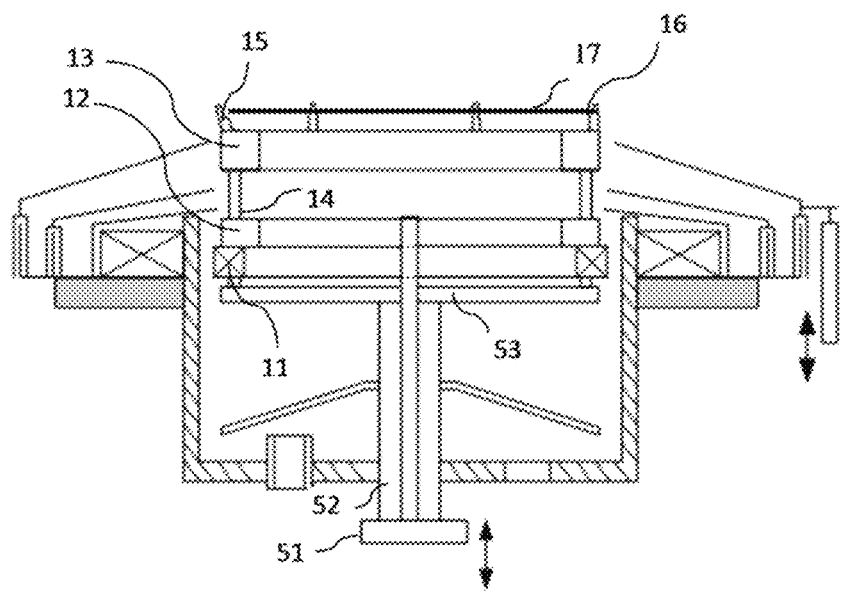
FIG. 3 is a structure diagram showing the device for holding and rotating a plate shaped article under a processing status according to an embodiment of the present invention.

Referring to FIG. 3, which is a structure diagram showing the device for holding and rotating a plate shaped article under a processing status according to a preferred embodiment of the present invention, the movable base 13 is moved up by the lifting mechanism (the indication of the arrows in the figure is the same as that in FIG. 1). Please also refer to FIG. 1, which illustrates the device for holding and rotating a plate shaped article under a processing status when the movable base 13 is moved down by the lifting mechanism. As shown in FIG. 1 and FIG. 3, the lifting mechanism ascends or descends the vertical connecting rods 52 through the lifting driving unit 51, and also ascends or descends the horizontal top plate 53 mounted on the top ends of the connecting rods 52, then the top plate 53 moves the three supporting rods 14 up or down, such that the movable base 13 goes up from (as shown in FIG. 3) or falls down (as shown in FIG. 1) to the fixed base 12. In an alternative embodiment, the lifting driving unit 51 can be an air cylinder, an electric actuator or other linear driving mechanism.

According to the device for holding and rotating a plate shaped article of the present invention, the rotation of the pivot pin 15 is accomplished by magnet drive. Specifically, a first magnetic body is mounted on a lower portion of each pivot pin 15 below its pivot, a second magnetic body connected to the movable base and a third magnetic body connected to the fixed base are mounted outside the pivot pin opposing two sides of the first magnetic body. Each two adjacent magnetic bodies have the same pole on their opposing surfaces, a repulsive force between the first magnetic body and the third magnetic body is greater than that between the first magnetic body and the second magnetic body.

Figure 4:
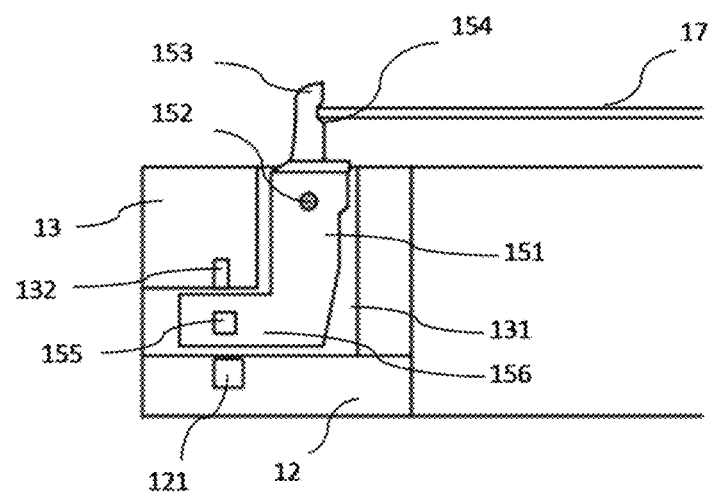
FIG. 4 is a structure diagram showing the pivot pin of the device for holding and rotating a plate shaped article according to an embodiment of the present invention.

In an alternative embodiment, please refer to FIG. 4. FIG. 4 is a structure diagram showing the pivot pin of the device for holding and rotating plate shaped article according to a preferred embodiment of the present invention, the pivot pin 15 is L-shaped and fitted in a chamber 131 having a corresponding shape with a spacing formed therebetween. The chamber 131 is formed in the movable base 12 and penetrates the movable base 13 from up to down. The L-shaped pivot pin 15 has a vertical portion 151 rotatable around a horizontal pivot shaft 152 which is connected to an inner wall of the chamber 131. The upper end 153 of the vertical portion extends from the chamber 131 and protrudes the upper surface of the movable base 13. The horizontal portion 156 of the L-shaped pivot pin 15 extends towards the outer of the movable base 13.

Please refer to FIG. 4. The center of gravity of the pivot pin 15 (not shown) is positioned outside and below the pivot shaft 152. The first magnetic body 155 is positioned in the horizontal portion 156 outside and below the center of gravity of the pivot pin 15. The second magnetic body 132 is positioned above the first magnetic body on the inner wall of the chamber 131. The third magnetic body 121 is positioned below the first magnetic body at a corresponding position in the fixed base 12. The chamber 131 has an opening formed below the horizontal portion 156 to communicate with the corresponding position in the fixed base 12.

Please refer to FIG. 4. Preferably, the first magnetic body 155, the second magnetic body 132 and the third magnetic body 121 are permanent magnets (described as "first magnet", "second magnet" and "third magnet" below). In an embodiment, the N pole of the first magnet 155 is positioned upward and the S pole is positioned downward, the N pole of the second magnet 132 is positioned down ward and the S pole is positioned upward, the S pole of the third magnet 121 is positioned upward and the N pole is positioned downward. The magnetic fields of the magnets 155, 132, 121 are all in a vertical orientation, thus to form magnetic repulsive forces between the first magnet 155 and the second magnet 132 and between the first magnet 155 and the third magnet 121. Furthermore, the magnet repulsive force between the first magnet and the third magnet is greater than that between the first magnet and the second magnet.

The motion driving principle of the pivot pin is that, when the plate shaped article is to be clamped by the pivot pins, the lifting mechanism drives the movable base to move down to the fixed base, each of the pivot pins is rotated towards the inner of the movable base by the repulsive force between the first magnet and the third magnet which is greater than the repulsive force between the first magnet and the second magnet, and clamps the plate shaped article placed on the fixed pins in a direction towards the opposing fixed pin; when the plate shaped article is to be released, the lifting mechanism drives the movable base to move up away from the fixed base, since the first magnet and the third magnet are too far away to produce an effective magnetic repulsive force, each of the pivot pins is only driven by the repulsive force between the first magnet and the second magnet to rotate towards the outer of the movable base and release the plate shaped article in a reverse direction.

Figure 5:
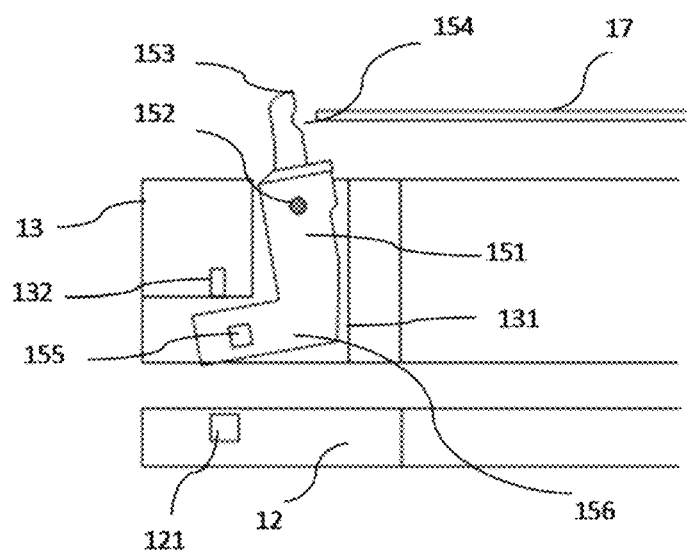
FIG. 5 is a structure diagram showing the pivot pin of the device for holding and rotating a plate shaped article under a release status according to an embodiment of the present invention.

In a preferred embodiment, as shown in FIG. 5, which is a structure diagram showing the pivot pin of the device for holding and rotating plate shaped article under a working status according to a preferred embodiment of the present invention. The pivot pin 15 is under a working status of releasing the plate shaped article 17. Please also refer to FIG. 4, which illustrates the pivot 15 under a working status of clamping the plate shaped article 17. As shown in FIG. 4 and FIG. 5, in order to achieve a faster and more reliable release of the pivot pins 15 under the magnetic repulsive force, and a gentle transition from the release status to the clamp status without causing impacts and damages to the plate shaped article and further generating particles, the center of the gravity of the pivot pin 15 (not shown) is designed to be positioned outside and below the pivot shaft 152. Such design can be accomplished easily by the structure of the horizontal portion of the L-shaped pivot pin 15 which extends outwardly.

Please refer to FIG. 4 and FIG. 5. When the plate shaped article is to be released by the pivot pins 15, the lifting mechanism drives the movable base 13 to move up away from the fixed base 12. Hence, the first magnet 155 and the third magnet 121 are separated far away from each other with no effective magnetic repulsive force produced therebetween. At this time, each of the pivot pins 15 is only affected by the repulsive force between the first magnet 155 and the second magnet 132. Meanwhile, since the center of the gravity of the pivot pin 15 is offset to the horizontal portion of the L shape, the pivot pin 15 itself will rotate around the pivot shaft 152 counter clockwise under a free status as shown in the figures. Therefore, the pivot pins rapidly rotate towards the outer of the movable base 13 and release the plate shaped article 17 under the resultant force of the gravity torque and the magnetic repulsive force between the first magnet 155 and the second magnet 132. When the plate shaped article is to be clamped by the pivot pins 15, the lifting mechanism drives the movable base 13 to move down to the fixed base 12. At this time, the first magnet 155 and the third magnet 121 are close to each other to produce a magnetic repulsive force greater than the repulsive force between the first magnet 155 and the second magnet 132. Furthermore, by achieving a magnetic repulsive force between the first magnet and the third magnet greater than the resultant force of the magnetic repulsive force between the first magnet and the second magnet and the gravity torque of the pivot pin, each of the pivot pins is rotated gently towards the inner of the movable base 13 around its pivot shaft 152 by the greater repulsive force between the first magnet and the third magnet, and clamps the plate shaped article 17 placed on the fixed pins 16 in a direction towards the opposing fixed pin 16.

From FIG. 4 and FIG. 5, it is known that the rotation angle (the maximum rotation angle around the pivot shaft) of the pivot pin 15 is limited by a spacing between the vertical portion 151 of the pivot pin 15 and the vertical portion of the inner wall of the chamber 131. Furthermore, the clamping force of the pivot pin 15 is determined by the repulsive force between the first magnet 155 and the third magnet 121. Therefore, appropriate rotation angle of the pivot pin 15 and clamping force acting on the edge of the plate shaped article by the pivot pin 15 can be achieved through reasonable machining to the spacing between the chamber of the movable base and the pivot pin 15, and proper selection of the magnets. Preferably, when the pivot pin 15 is at a clamping position, the horizontal portion 156 of the L-shaped pivot pin 15 is not in contact with the movable base 13 or the fixed base 12.

Figure 6:
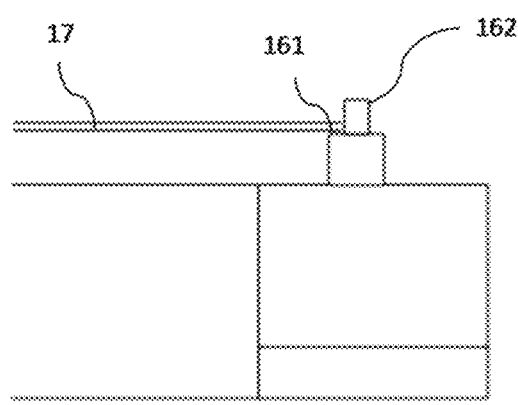
FIG. 6 is a structure diagram showing the fixed pin of the device for holding and rotating a plate shaped article according to an embodiment of the present invention.

Please refer to FIG. 6, which is a structure diagram showing the fixed pin of the device for holding and rotating a plate shaped article according to an embodiment of the present invention. As shown in FIG. 6, the fixed pin 16 has, at its inner side, a horizontal supporting surface 161 for placing the plate shaped article 17, and a vertical limiting surface 162 together with the pivot pins 15 for holding the plate shaped article 17 and limiting a lateral movement of the plate shaped article 17. Please refer to FIG. 4 and FIG. 5, the pivot pin 15 has an arc-shaped groove 154 formed at the inner side of the upper portion 153 protruding the upper surface of the movable base 13, for clamping the plate shaped article 17 together with the fixed pins 16. When the pivot pins 15 are at the clamping positions, the grooves 154 of the pivot pins 15 have the same height with the active holding surfaces provided by the supporting surfaces 161 of the fixed pins 16, and match with the shape of the plate shaped article 17, which facilitate synchronous clamping by the pivot pins 15 and simultaneous limit to the lateral movement of the plate shaped article 17 towards the outer of the movable base 13 by the limiting surfaces 162 of the fixed pins 16.

In addition, in order to prevent a relative movement between the movable base 13 and the fixed base 12 during the rotation along with the rotatable chuck 11, a limit structure or an engagement structure may be provided therebetween. Alternatively, multiple attractive permanent magnets (not shown) are provided respectively on two opposing surfaces of the movable base 13 and the fixed base 12 to ensure the relative position.

Please refer to FIG. 1 to FIG. 6, during the operation of the device for holding and rotating the plate shaped article, firstly the lifting mechanism is actuated to lift the supporting rod, which also ascends the movable base 13 away from the fixed base 12. Each of the pivot pins 15 rotates counter clockwise under the resultant force of the gravity torque and the magnetic repulsive force between the first magnet and the second magnet to make its upper end swing towards the outer of the movable base 13, such that the pivot pin 15 is in an open status providing an enlarged distance to the opposing fixed pin 16. At this time, the mechanical hand may place the plate shaped article (e.g. semiconductor products like chip of silicon or wafer) on the supporting surfaces of the fixed pins 16 from above the opening of the processing chamber 3.

Then, the lifting mechanism is inversely actuated to descend the movable base 13 supported by the supporting rods, each of the pivot pins 15 is rotated clockwise by the greater repulsive force between the first magnet and the third magnet against the resultant force of the magnetic repulsive force between the first magnet and the second magnet and the gravity torque of the pivot pin, to make its upper end swing towards the inner of the movable base 13. Each of the pivot pins 15 gradually rotates towards the opposing fixed pin to clamp the plate shaped article 17 in a direction to the opposing fixed pin. The fixed pins 16 limit the clamping positions of the plate shaped article 17 through the limiting surfaces. The active holding surfaces provided by the pivot pins 15 and the fixed pins 16 are defined in accordance with the rotation angle of the pivot pins 15. The clamping force of the pivot pins 15 is determined by the magnetic repulsive force between the first magnet and the third magnet (should be against the resultant force of the magnetic repulsive force between the first magnet and the second magnet and the gravity torque of the pivot pin).

When the plate shaped article 17 is clamped, the upper and lower nozzles are turned on to spray processing medium to the upper and lower surfaces of the plate shaped article 17. The annular stator 2 is actuated to generate an alternating magnetic field by feeding an alternating current to the coil windings, thus the rotatable chuck with the magnetism mechanism produces a magnetic field having an opposite orientation to drive the rotatable chuck 11 to suspend and rotate in the processing chamber 3 to perform the process. Meanwhile, various channels of the collecting vessel are ascended and descended respectively to their required positions in different processing stages to collect different processing medium splashed from the plate shaped article 17 by the centrifugal force generated by the rotation of the rotatable chuck 11. The processing medium not collected by the vessel flows along the umbrella-shaped guide sleeve 33 to the bottom of the processing chamber 3 and discharged from the liquid outlet 32. The processed gaseous median is exhausted from the processing chamber through the exhaust outlet 31.

After the process, the process equipment is deactivated. The movable base 13 is moved up again and the pivot pins 15 are released. The mechanical hand picks up the plate shaped article 17 to accomplish the whole process.

In conclusion, according to the present invention, by providing a group of fixed pins 16 and a group of pivot pins 15 which are arranged circumferentially along the movable base 13 in a manner that each pivot pin 15 opposites a fixed pin 16, and by positioning magnets within the horizontal portions of the pivot pins as well as the movable base 13 and fixed base 12 which are arranged above and below the horizontal portions and driving each of the pivot pins to rotate around its pivot back and forth under the magnetic repulsive force between two adjacent magnets to release or clamp the plate shaped article 17 placed on the supporting surfaces of the fixed pins 16, the adverse impact of the centrifugal force and the gravity on the clamping action of the pivot pins 15 can be avoided, reliable clamping to the plate shaped article 17 can be achieved. Furthermore, with the ascending and descending of the lifting mechanism and the spacing of the chamber accommodating the pivot pins 15, the rotation orientation and rotation angle of the pivot pins can be controlled conveniently; with the appropriate selection of the magnets, a proper clamping force acting on the edge of the plate shaped article by the pivot pin can be realized. It also achieves convenience for maintenance and small space occupation for the processing chamber. Accordingly, the present invention has advantages of simple structure, convenient and reliable action control, controllable clamping force and good compatibility with various processing chambers.

While this invention has been particularly shown and described with references to preferred embodiments thereof. This invention may, however, be embodied in different forms and should not be construed as limited to the embodiments set forth herein. It will be understood by those skilled in the art that various changes in form and details may be made herein without departing from the spirit and scope of the invention as defined by the appended claims.

The invention claimed is:

1. A device for holding and rotating a plate shaped article, comprising:
   an annular rotatable chuck which is horizontally rotated when driven by a force;
   an annular movable base and an annular fixed base which are positioned on the rotatable chuck from top to bottom and rotated synchronously with the rotatable chuck, wherein the movable base is drivable to move up or down;
   a group of fixed pins and a group of pivot pins protruding from an upper surface of the movable base and arranged circumferentially along the movable base;

wherein the fixed pins are fixedly connected to the movable base, the pivot pins are rotatably connected to the movable base, each of the pivot pins is positioned opposite to a fixed pin; a lower portion of each of the pins below its pivot is provided with a first magnetic body; a second magnetic body connected to the movable base and a third magnetic body connected to the fixed base are provided outside each of the pivot pins opposing two sides of the first magnetic body; each two adjacent magnetic bodies of the first, the second and the third magnetic bodies have a same pole on their opposing surfaces, a repulsive force between the first magnetic body and the third magnetic body is greater than a repulsive force between the first magnetic body and the second magnetic body;

wherein, when the movable base moves down, each of the pivot pins rotates towards an inside of the movable base by the repulsive force between the first magnetic body and the third magnetic body and clamps the plate shaped article placed on the fixed pins in a direction towards an opposing fixed pin; when the movable base moves up, each of the pivot pins rotates towards an outside of the movable base by the repulsive force between the first magnetic body and the second magnetic body and releases the plate shaped article in a reverse direction.

2. The device according to claim 1, wherein each of the pivot pins is L-shaped and is fitted in a chamber having a corresponding shape with a spacing therebetween; the chamber is formed in the movable base and penetrates the movable base from up to down; the pivot pin has a vertical portion and a horizontal portion; the vertical portion is rotatable around a horizontal pivot shaft which is connected to an inner wall of the chamber, and has an upper end which extends from the chamber and protrudes an upper surface of the movable base; the horizontal portion extends outwardly; a center of gravity of the pivot pin is positioned outside and below the pivot shaft; the first magnetic body is positioned in the horizontal portion outside and below the center of gravity of the pivot pin; the second magnetic body is positioned above the first magnetic body and connected to the inner wall of the chamber, the third magnetic body is positioned below the first magnetic body and connected to the fixed base; the chamber has an opening formed below the horizontal portion; a bottom surface of the movable base is fixedly connected with a plurality of supporting rods which are arranged circumferentially along the movable base; the supporting rods penetrate the fixed base and the rotatable chuck sequentially; a lifting mechanism is provided below the rotatable chuck to drive the supporting rods up or down, so as to enable the movable base to go up from or fall down to the fixed base to allow the pivot pins to rotate towards the outside of the movable base around the pivot shaft under a resultant force of the repulsive force between the first magnetic body and the second magnetic body and a gravity torque to release the plate shaped article placed on the fixed pins, or rotate towards the inner of the movable base around the pivot shaft under the repulsive force between the first magnetic body and the third magnetic body against the gravity torque, to clamp the plate shaped article.

3. The device according to claim 1, wherein each of the fixed pins has a supporting surface for placing the plate shaped article, and also has a limiting surface together with the pivot pins for holding the plate shaped article and limiting a lateral movement of the plate shaped article; each of the pivot pins has a groove for clamping the plate shaped article at its inner side; active holding surfaces provided by the pivot pins and the fixed pins have a same height and match with a shape of the plate shaped article.

4. The device according to claim 2, wherein the lifting mechanism comprises a lifting driving unit, connecting rods and a top plate which are sequentially connected; the lifting driving unit ascends or descends the connecting rods, and accordingly drives the top plate to ascend or descend the supporting rod, so as to enable the movable base to go up from or fall down to the fixed base.

5. The device according to claim 1, wherein the first magnetic body, the second magnetic body and the third magnetic body are permanent magnets.

6. The device according to claim 2, wherein a rotation angle of each of the pivot pins is limited by a spacing between the vertical portion of the respective pivot pin and a vertical portion of the inner wall of the chamber.

7. The device according to claim 1, wherein a clamping force of each of the pivot pins is determined by the repulsive force between the first magnetic body and the third magnetic body.

8. The device according to claim 1, wherein the amount of the pivot pins is at least two, the amount of the fixed pins is at least three.

9. The device according to claim 1, wherein the movable base, the fixed base and the rotatable chuck are concentrically arranged in an annular form; a plurality of attractive permanent magnets are respectively positioned on opposing surfaces of the movable base and the fixed base; the fixed base is fixedly connected to the rotatable chuck.

10. The device according to claim 1, wherein a processing chamber having an opening at an upper end is arranged enclosing the rotatable chuck with a spacing formed therebetween, a ring stator is arranged enclosing the processing chamber; the ring stator is provided with multiple coil windings; the rotatable chuck is provided with a corresponding magnetism mechanism; the ring stator generates an alternating magnetic field when the multiple coil windings are fed with an alternating current, such that the magnetism mechanism in the rotatable chuck produces a magnetic field having an opposite orientation to drive the rotatable chuck to suspend and rotate in the processing chamber; nozzles are provided above and below the fixed pins and the pivot pins for spraying processing medium to an upper surface and a lower surface of the plate shaped article; an umbrella-shaped guide sleeve is provided within the processing chamber below the rotatable chuck for guiding the processing medium; a liquid outlet and an exhaust outlet are formed in the processing chamber; a movable multi-channel collecting vessel is provided above the opening of the processing chamber for collecting different processing medium splashed from the surface of the plate shaped article by the centrifugal force.

11. The device according to claim 2, wherein each of the fixed pins has a supporting surface for placing the plate shaped article, and also has a limiting surface together with the pivot pins for holding the plate shaped article and limiting a lateral movement of the plate shaped article; each of the pivot pins has a groove for clamping the plate shaped article at its inner side; active holding surfaces provided by the pivot pins and the fixed pins have a same height and match with a shape of the plate shaped article.

12. The device according to claim 2, wherein the first magnetic body, the second magnetic body and the third magnetic body are permanent magnets.

13. The device according to claim 2 wherein a clamping force of each of the pivot pins is determined by the repulsive force between the first magnetic body and the third magnetic body.

14. The device according to claim 2, wherein the amount of the pivot pins is at least two, the amount of the fixed pins is at least three.

15. The device according to claim 2, wherein the movable base, the fixed base and the rotatable chuck are concentrically arranged in an annular form; a plurality of attractive permanent magnets are respectively positioned on opposing surfaces of the movable base and the fixed base; the fixed base is fixedly connected to the rotatable chuck.

16. The device according to claim 2, wherein a processing chamber having an opening at an upper end is arranged enclosing the rotatable chuck with a spacing formed therebetween, a ring stator is arranged enclosing the processing chamber; the ring stator is provided with multiple coil windings; the rotatable chuck is provided with a corresponding magnetism mechanism; the ring stator generates an alternating magnetic field when the multiple coil windings are fed with an alternating current, such that the magnetism mechanism in the rotatable chuck produces a magnetic field having an opposite orientation to drive the rotatable chuck to suspend and rotate in the processing chamber; nozzles are provided above and below the fixed pins and the pivot pins for spraying processing medium to an upper surface and a lower surface of the plate shaped article; an umbrella-shaped guide sleeve is provided within the processing chamber below the rotatable chuck for guiding the processing medium; a liquid outlet and an exhaust outlet are formed in the processing chamber; a movable multi-channel collecting vessel is provided above the opening of the processing chamber for collecting different processing medium splashed from the surface of the plate shaped article by the centrifugal force.

* * * * *